United States Patent [19]
Imsdahl

[11] Patent Number: 5,003,431
[45] Date of Patent: Mar. 26, 1991

[54] INSERTION, EXTRACTION, AND CLAMPING APPARATUS FOR ELECTRICAL MODULES

[75] Inventor: John A. Imsdahl, Richfield, Minn.
[73] Assignee: Unisys Corporation, Blue Bell, Pa.
[21] Appl. No.: 452,036
[22] Filed: Dec. 18, 1989
[51] Int. Cl.$^5$ .............................................. H05K 7/14
[52] U.S. Cl. ...................................... 361/415; 211/41; 361/391; 439/64
[58] Field of Search ...................... 165/80.2, 80.3, 185; 211/41; 361/383-389, 391, 412, 415; 439/64, 161, 267, 485

[56] References Cited

U.S. PATENT DOCUMENTS

| | | | |
|---|---|---|---|
| 3,467,891 | 9/1969 | Mogle | 361/386 |
| 4,114,605 | 11/1983 | Chino et al. | 361/386 |
| 4,480,287 | 10/1984 | Jensen | 361/386 |

FOREIGN PATENT DOCUMENTS

0289686 11/1988 European Pat. Off. ............ 361/386

Primary Examiner—Gregory D. Thompson
Attorney, Agent, or Firm—Seymour Levine; Glenn W. Bowen; Mark T. Starr

[57] ABSTRACT

An apparatus for moving a module in a guide channel includes levers which cooperate with cams associated therewith and contacting edges extending from the guide channels to apply forces for positioning the module. These forces are coupled to movable wedges, guided by wedges fixed to the module, which contact the walls of the guiding channels to clamp the module. Clamping forces are maintained by compressible elements such as Belleville washers or suitable springs coupled to the wedges fixed on the module.

5 Claims, 5 Drawing Sheets

INSERTION, EXTRACTION, AND CLAMPING APPARATUS FOR ELECTRICAL MODULES

BACKGROUND OF THE INVENTION

1. Field of the Invention

The invention relates generally to electronic modules, and more particularly, to mechanisms for inserting, extracting, and clamping these modules with a mated mother or matrix board.

2. Description of the Prior Art

Electronic modules must be rigidly clamped into their resident card guides to minimize damage to the modules and maintain good electrical contact and resist damage when subjected to shock, vibration, and/or high temperature. Typically, this is accomplished with the use of wedge clamped typed devices external to the device or by a lever integral to the device, such as disclosed in U.S. Pat. No. 3,767,974. Another device inserts the module into the mother board and extracts it therefrom. This device is typically an external tool or less frequently an integral lever actuated device. Thus, this prior art requires one element for clamping the circuit board into position and another element for inserting and extracting the element from the mother board.

Many applications mandate insertion/extraction and clamping in a single element that is integral with the module to provide quick and simple insertion/extraction and clamping. Such a device is disclosed in U.S. Pat. No. 4,780,792. This device, however, requires a module of complex construction and utilizes appreciable real estate on the module, real estate better used for electronic circuitry.

SUMMARY OF THE INVENTION

In accordance with the principles of the invention, a module, comprising circuit cards and a frame, is inserted and extracted from mating connectors in mother boards by a lever mounted on the frame of the module which cooperates with fixed wedges, movable wedges, and Belleville washers to clamp the frame in a resident card guide. The lever is constructed with a cam shaped end opposite the handle which rides on a fixed pin attached to the frame to control the angular movement of the handle. A second cam coupled to the lever, rides on a flat washer positioned at the top of the frame and is constructed so that the position of the handle controls the forces applied to the movable wedges by the Belleville washers in cooperation with the second cam. A hook terminating the cam shaped end contacts the underside of a loop located at the top of the card guide to force the card into the connector in the mother board. When the handle is positioned parallel to the top of the card frame, the second cam causes the Belleville washers to apply the force which causes the movable wedges to be in full contact with the walls of the card guide, locking the frame and card firmly in the card guide.

When the handles are lifted from the top of the card frame through an angle sufficient to disengage the hook terminating the cam shaped end from the underside of the lip of the card guide, the frame and card combination may be easily removed from the mating connectors and extracted from the card guide.

Additional features and advantages of the invention will become apparent from the following detailed description of the invention when considered in conjunction with the accompanying drawings.

DESCRIPTION OF THE PREFERRED EMBODIMENT

Figure 1:
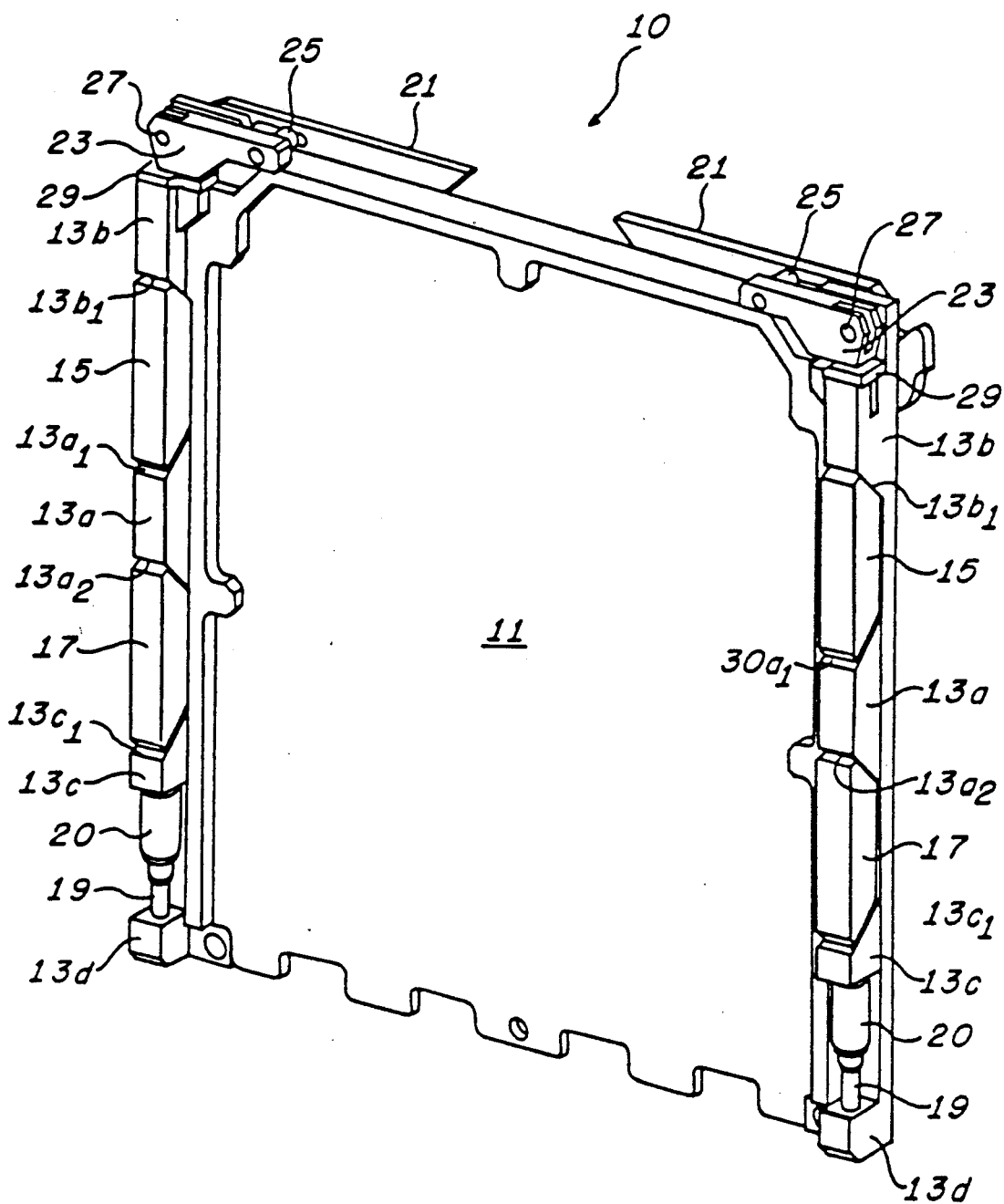
FIG. 1 is a triometric view of the module in its frame showing the levers, fixed and movable wedges, and the Belleville washers of the invention.

Refer to FIG. 1 where a card-frame assembly, generally indicated at 10, is shown. The card 11 is inserted in a frame 13 which contains center sections 13$a$ having wedged upper and lower surfaces 13$a_1$ and 13$a_2$, respectively, upper sections 13$b$ having a wedge lower surface 13$b_1$, and a lower section 13$c$ having a wedge upper surface 13$c_1$. Upper movable wedges 15 with ends which match the wedge surfaces 13$a_1$ and 13$b_1$ are inserted between the frame sections 13$a$ and 13$b$, and lower movable wedges 17 with ends which match the surfaces 13$a_2$ and 13$c_1$ are inserted between the sections 13$a$ and 13$c$. As will be explained, the side walls and the movable wedges 15, 17 are inserted in a card guide, not shown, in a manner to force the movable wedges to make positive contact with the walls of the guide. Inserted between the lower sections 13$c$ and end sections 13$d$ of the frame are rods 19 which support Belleville washers 20 which, as will be explained, provide the forces for clamping the card-frame 10 in the card guide for positive insertion in the card connector. Mounted at the top of the frame are levers 21 which are coupled to cams 23 by guide pins 25. Spring pins, located at the cam pivots 27, couple cams 23 to the frame. Wedge clamp washers 29 positioned at the flat top surfaces of the side frame sections 13$b$ provide the riding surfaces for the cams 23.

It should be understood that wedges 15 and 17 move perpendicular to the plane of the frame and, guided by the rod 19, move parallel to the frame along with wedges 13$a$ and 13$c$.

Figure 2A:
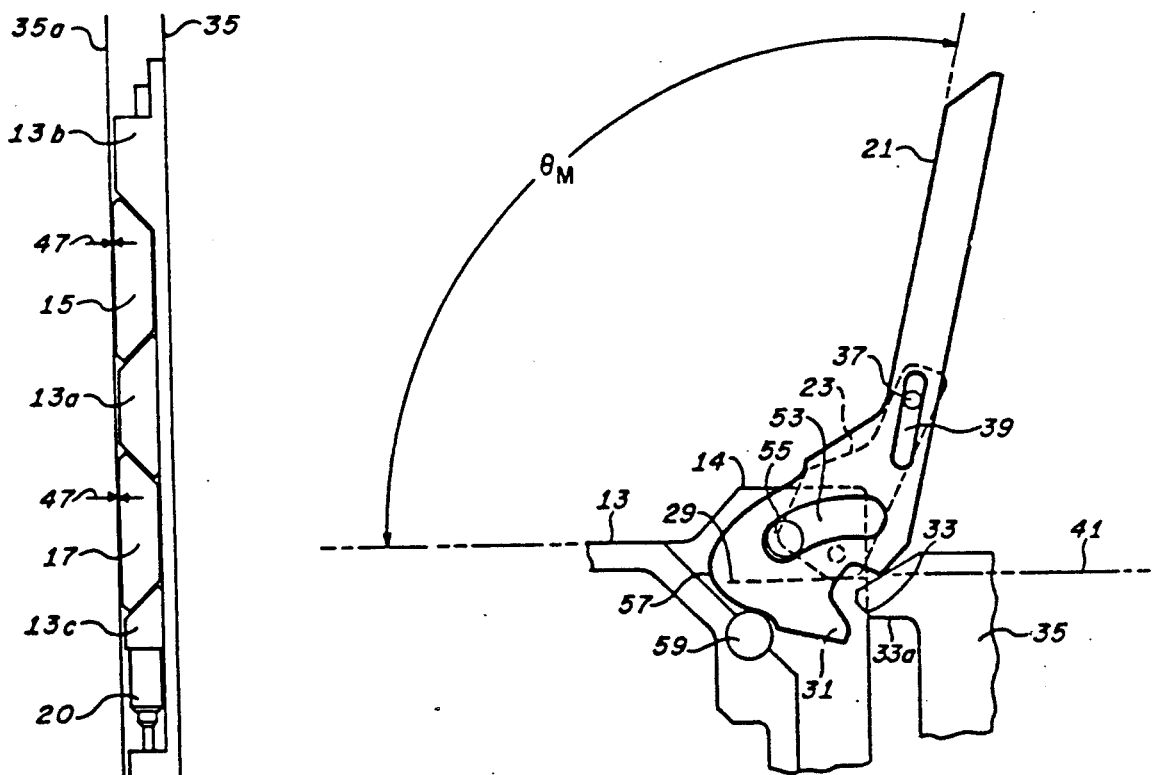
FIGS. 2A through 2C are illustrations of the lever at various angles relative to a reference line representative of the top of the frame when it is fully inserted in the card guide. Shown in the FIGURES are the positions of the cam relative to the fixed pin and the positions of the movable wedges relative to the walls of the card guide.
Figure 2B:
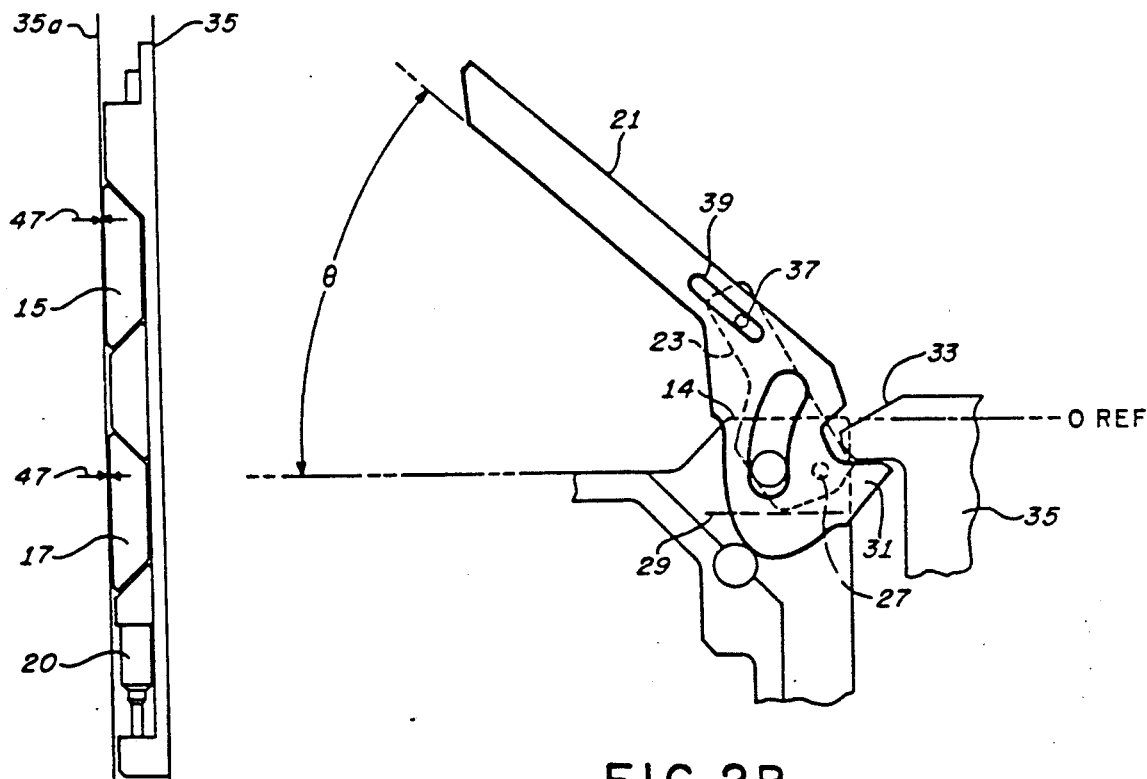

Operation of the lever action will be described with reference to FIGS. 2A, 2B, and 2C wherein elements previously described bear the reference numeral initially assigned. In FIG. 2A, the lever 21 is shown in its maximum extended position forming an angle $\theta_M$ with the top of the frame 13, which may be 102°. In this position of the lever, adequate clearance between an end hook 31 of the lever and a lip 33, extending from a side wall 35 of the card-guide, is provided to allow extraction and insertion of the frame 13 into the guide. With the lever in this position, the cam 23, which rides on the top surface of the washer 29 and with its movement controlled by a guide pin 37 riding in a slot 39 through the lever 21, may have its pivot 27 at a distance of 0.11" above the top surface of the washer 29 as shown by the graph 43 with reference to the lefthand scale in FIG. 3. Also, with reference to the lefthand scale in FIG. 3, when the lever is in its maximum angular position (100 degrees) relative to the top of the frame, the top of the frame 13 is 0.37" above a reference line. This reference line is representative of the top of the frame 13 when the card is fully inserted into the mating connector of the mother board (lever at 40 degrees and below), as indicated by the graph 45. When lever 21 is in its maximum angular position, the Belleville washers 20 are not compressed and no force is applied to the movable wedges 15 and 17. In the absence of any force, a gap 47 exists between one side wall 35a of the guide and the movable wedges 15 and 17 that is equal to 0.02 as indicated by the graph 49 with reference to the righthand scale in FIG. 3. Graph 51 in FIG. 3, which is reference to the righthand scale, provides the compression distance of the Belleville washers 20 as a function of the lever angle. As the arm of the lever 21 is rotated, its angular position is determined by the walls of the guide slot 53 directed by a second fixed guide pin 55 and a cam shaped end section 57 riding on the third fixed guide pin 59.

As the lever angle decreases from its maximum extension $\theta_M$, the gap 47 and the distance of the cam pivots 27 above the reference remain constant until the angle is decreased to approximately 60°. As the lever angle $\theta$ continues to decrease, contact between the end hook 31 and the underside 33a of the lip 33 commences as indicated in FIG. 2B. When the angle $\theta$ is decreased to approximately 38°, the gap 47 has disappeared and the movable wedges 15 and 17 are in contact with the side wall 35a of the card guide. Until this angle has been achieved the forces exerted by the contact of the end hook 31 with the underside 33a of the lip 33 are insufficient to compress the Belleville washers 20, and indicated by the graph 51 in FIG. 3. At the angle at which the gap 47 has been reduced to zero, the height of the cam pivots 27 above the top surface of the washer 29 has increased to approximately 0.17". Prior to the closing of the gap 47, the top of the frame 13, indicated at 14, has been reduced to the level of the reference, this having occurred at approximately 40°. As the lever angle continues to decrease, the Belleville washers 20 are compressed as indicated by the graph 51 and the height of the pivot above the top of the washer 29 continues to increase as indicated by the graph 43.

Figure 2C:
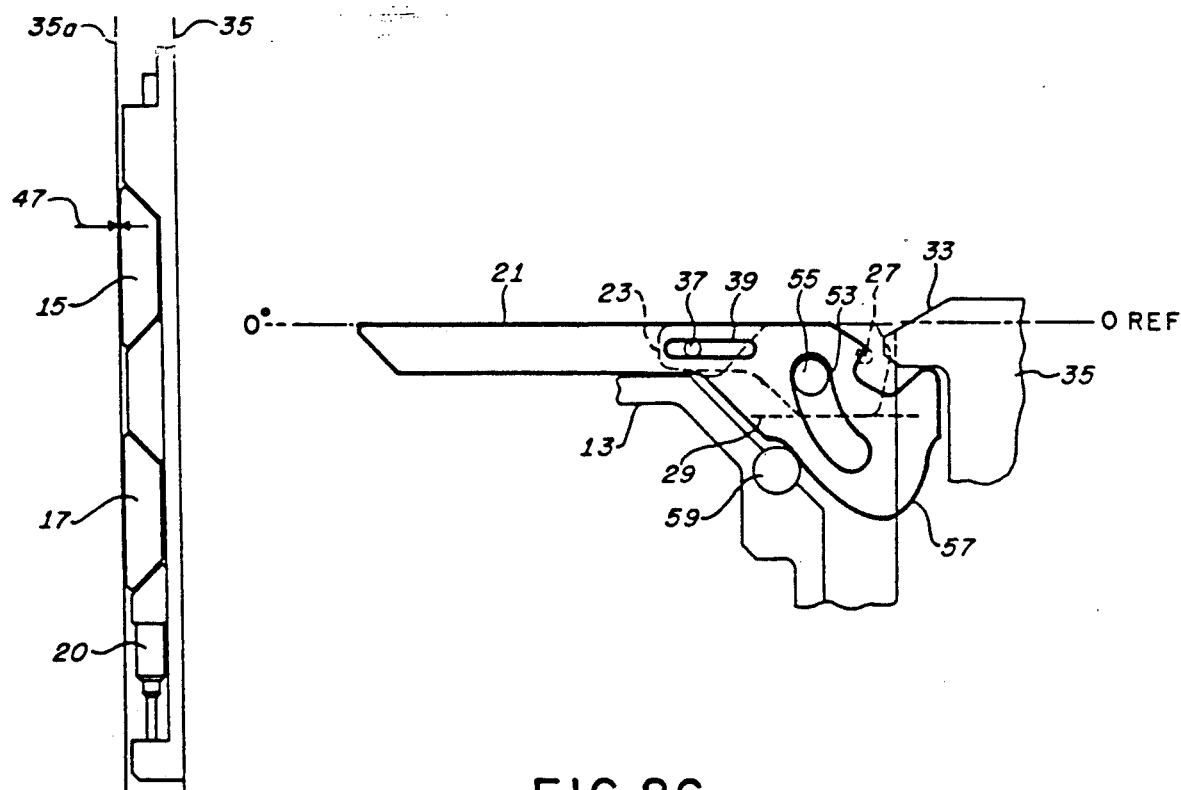
Figure 3:
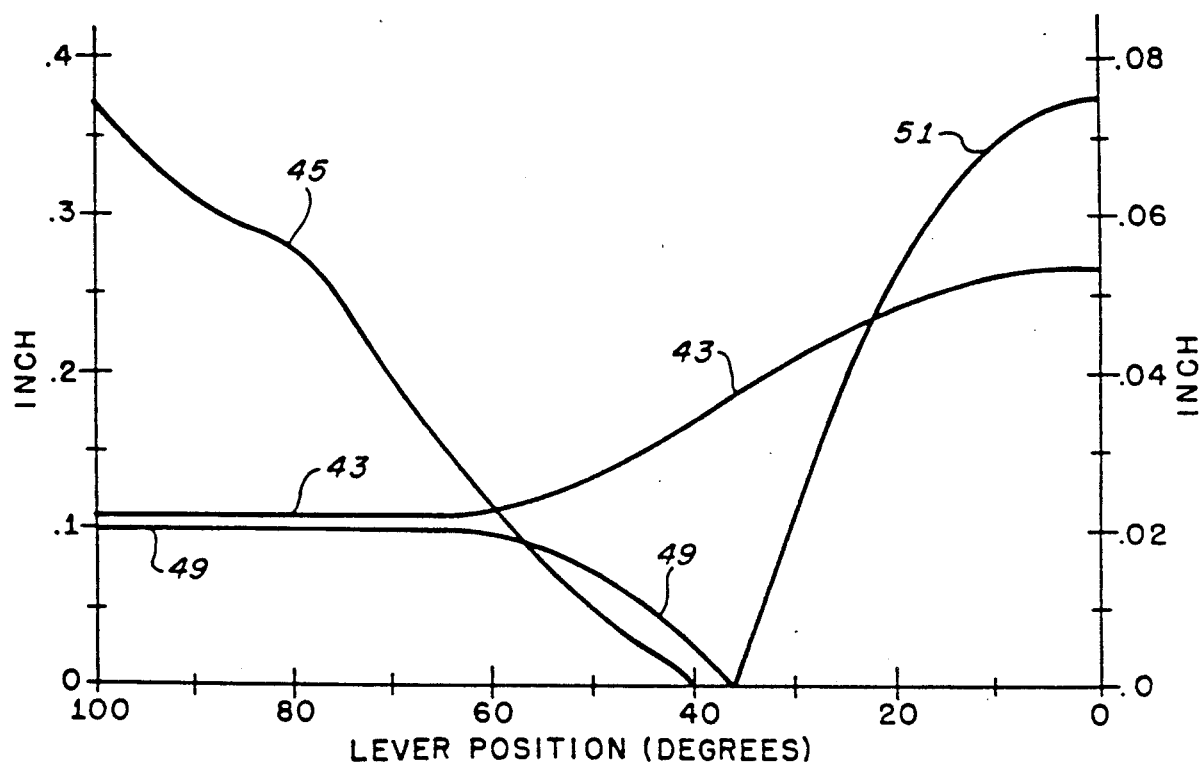
FIG. 3 is a graph indicating the distance of the cam pivot, the height of the Belleville washers, the gap between the movable wedges and the walls of the card guide, and the distance of the top of the card frame to the reference position as a function of the relative angle between the lever and the top of the card frame.

When lever 21 is at 0°, as indicated in FIG. 2C, the height of the pivots 27 above the flat washer 29 has risen to approximately 0.26" and the Belleville washers 20 have been compressed a distance of approximately 0.075". Under these conditions, the wedge clamp is activated with approximately 120 pounds of force.

While the invention has been described in its preferred embodiment, it is to be understood that the words which have been used are words of description rather than limitation and that changes may be made within the purview of the appended claims without departing from the true scope and spirit of the invention in its broader aspects.

I claim:

1. An apparatus for inserting and extracting a module relative to a fixed position, the apparatus comprising:
   means for positionally guiding said module:
   at least one lever mounted on said module for positioning said module in said guiding means, said at least one lever containing first and second elongated slots and having a shaped outer surface;
   a first fixed guide pin positioned in said first elongated slot;
   a second fixed guide pin positioned to be in contact with said shaped outer surface; and
   means on said module coupled to said at least one lever for clamping said module in said guiding means.

2. An apparatus in accordance with claim 1 wherein said module includes wedge clamp washers, and further including cam means pivotally positioned on said module to be in contact with said wedge clamp washers, said cam means having a guide pin movably positioned in said second elongated slot.

3. An apparatus in accordance with claim 2 wherein said guiding means includes lips extending from said guiding means and said at least one lever includes hook means for contacting said lips.

4. An apparatus in accordance with claim 3 wherein said clamping means includes:
   movable wedge means responsive to angular positions of said at least one lever for clamping said module in said guiding means;
   wedge means on said module for guiding said movable wedge means; and
   compressive means coupled to said wedge means and responsive to angular positions of said at least one lever for providing forces to said movable wedge means.

5. An apparatus in accordance with claim 4 wherein said compression means comprises Belleville washers.

* * * * *